United States Patent [19]

Aue et al.

[11] 4,346,311
[45] Aug. 24, 1982

[54] PULSE GENERATOR CIRCUIT

[75] Inventors: Peter Aue, Böblingen; Werner Hüttemann, Herrenberg-Kuppingen, both of Fed. Rep. of Germany

[73] Assignee: Hewlett-Packard GmbH, Böblingen, Fed. Rep. of Germany

[21] Appl. No.: 172,871

[22] Filed: Jul. 28, 1980

[30] Foreign Application Priority Data

Aug. 11, 1979 [DE] Fed. Rep. of Germany ....... 2932655

[51] Int. Cl.³ .......................... H03K 5/12; H03K 6/00
[52] U.S. Cl. .................................... 307/268; 307/263; 307/555
[58] Field of Search ................ 307/297, 268, 263, 237

[56] References Cited

U.S. PATENT DOCUMENTS 3,573,502  4/1971  Kan ..................................... 307/263
4,167,682  9/1979  O'Dea ................................. 307/237
4,251,743  2/1981  Hareyama ........................... 307/297
4,254,346  3/1981  Yamada et al. ...................... 307/268

Primary Examiner—John S. Heyman
Attorney, Agent, or Firm—A. C. Smith

[57] ABSTRACT

A pulse generator for generating pulses having predetermined slopes is disclosed, comprising a capacitor that can be charged and discharged through predetermined current sources, a switching device for connecting and disconnecting the current sources and a step function signal source for controlling the switching device. The capacitance of the capacitor is in the range of the stray capacitance of the switching device. A fraction of the output signal of the step function signal source is superimposed in oppposite phase upon the output signal of the capacitor so as to compensate the voltage surge in the output signal of the capacitor resulting from the voltage divider formed by the stray capacitance of the switching device and the capacitor.

4 Claims, 1 Drawing Figure

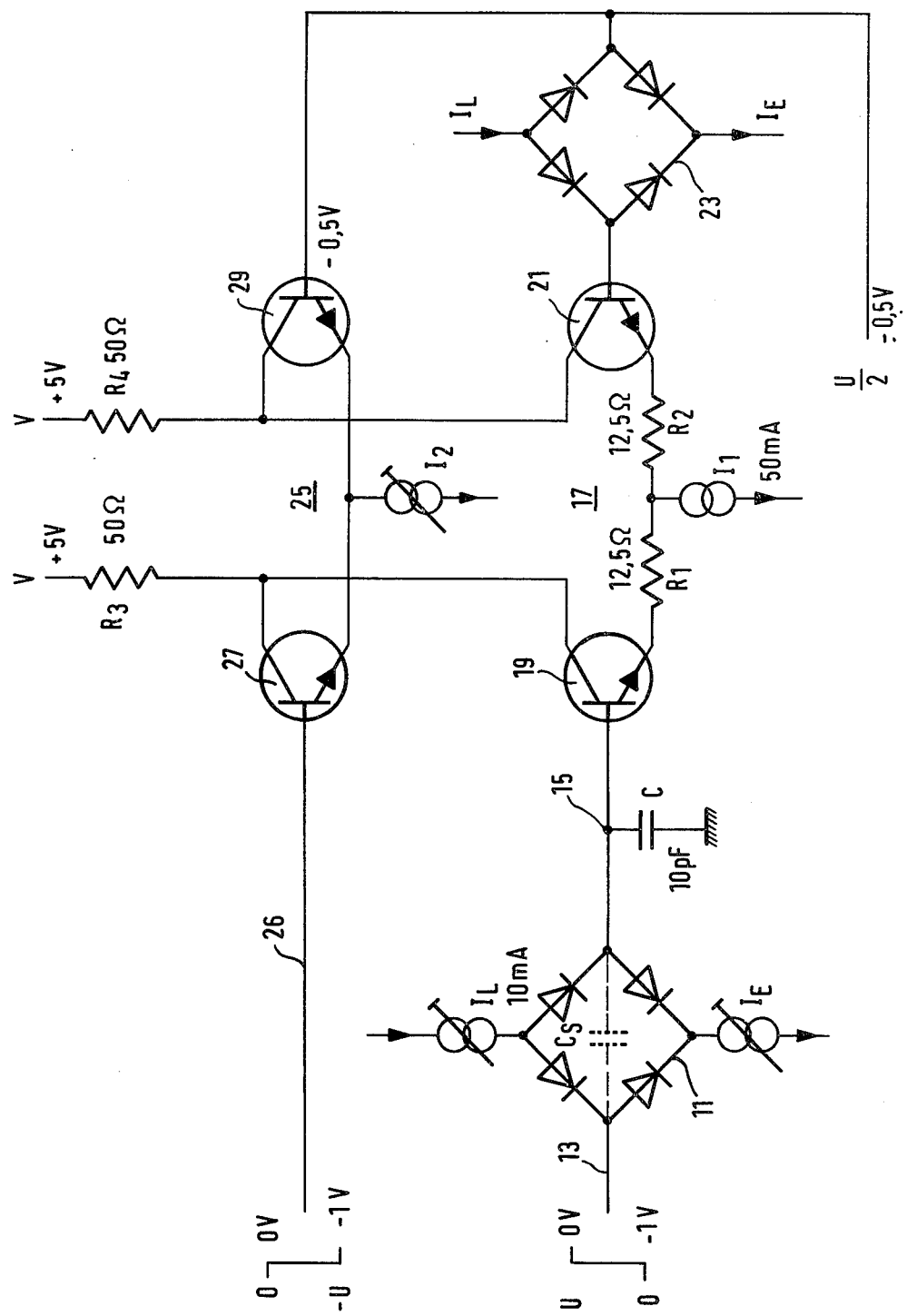

PULSE GENERATOR CIRCUIT

BACKGROUND OF THE INVENTION

The present invention relates to pulse generators for generating pulses having predetermined slopes, comprising a capacitor that can be charged and discharged through predetermined current sources, a switching device for connecting and disconnecting the current sources and a step function signal source for controlling the switching device.

In a pulse generator of this type, the rise and drop times of the generated pulses can be independently regulated by corresponding regulation of the current source.

However, the circuit is restricted to relatively long rise and drop times since the capacitance of the capacitor must be high as compared to the stray capacitance of the switching device. Short rise and drop times in the range of nanoseconds require an extremely small capacitor which does no longer differ substantially from the stray capacitance of the switching device. In this case, however, the stray capacitance and the capacitor form together a voltage divider which superimposes a specific fraction of the step function signal of the capacitor voltage and, thus, the output pulse signal. This in turn results in disturbing steps in the slope of the pulse.

SUMMARY OF THE INVENTION

It is an object of the invention to provide a pulse generator which generates pulses with stepless slopes even in the case of very short rise and drop times.

According to a preferred embodiment of the invention the capacitance of the capacitor is in the range of the stray capacitance of the switching device, and a fraction of the output signal of the step function signal source is superimposed in opposite phase upon the output signal of the capacitor so as to compensate the voltage surge in the output signal of the capacitor resulting from the voltage divider formed by the stray capacitance of the switching device and the capacitor.

THE DRAWING

In the drawing a circuit diagram of a preferred embodiment of the invention is shown.

DESCRIPTION OF THE PREFERRED EMBODIMENT

In the drawing C designates a capacitor whose potential gradient determines the shape of the output pulses emitted by the pulse generator. Charging and discharging of the capacitor C is effected through current sources $I_L$ and $I_E$, respectively. The two current sources $I_L$ and $I_E$ can be regulated to vary the charging and discharging speed of the capacitor C and, thus, the steepness of the rising and dropping slopes of the generated pulses. Given the fact that the two current sources $I_L$ and $I_E$ can be regulated independently of each other, the steepness of the two slopes can be regulated independently, too.

Current from the current sources $I_L$ and $I_E$ is supplied to the capacitor C via a switching device in the form of a diode bridge 11. For the diode bridge 11, Schottky-diodes are preferably used as these permit rapid switching. The switching action is released by a voltage surge U at one input 13 of the diode bridge 11. This voltage surge causes the current $I_L$ to be supplied to the capacitor C until the voltage U is reached also at 15. The voltage at 15 is then maintained at the value U until a negative voltage surge at the input 13 causes power to be supplied from the current source $I_E$ so as to discharge the capacitor C.

The signal obtained at 15 is supplied to a linear differential amplifier 17 comprising two NPN-transistors 19 and 21, which have their emitters connected to a common current source $I_1$, via resistors $R_1$ and $R_2$, respectively.

While the signal obtained at 15 is supplied to the base of the transistor 19, a signal serving to compensate a displacement of the operating point is supplied to the base of the transistor 21 via a diode bridge 23. The structure of the diode bridge 23 is identical to that of the diode bridge 11, and the impressed currents $I_L$ and $I_E$ are identical to those of the diode bridge 11. However, instead of voltage surges of the magnitude U, a constant voltage U/2 is supplied to the diode bridge 23.

The diode bridge 11 has a stray capacitance which is indicated in the drawing by a capacitor $C_s$ represented in dashed lines. This capacitance $C_s$ forms together with the capacitor C a capacitive voltage divider for the surge voltage U at the input 13. As a result, a surge voltage which is substantially equal to $U C_s/C$ is superimposed upon the capacitor voltage at 15. It is obvious that this surge voltage makes itself felt in a disturbing manner, unless $C_s << C$. This is always the case when the rising and dropping slopes of the pulses to be generated are to be very steep; so, the capacitor C must for instance have a capacitance in the range of 10 pF when the rise and/or drop time is to be approximately 1 ns. Now, if one assumes that the stray capacitance $C_s$ of the diode bridge 11 is in the area of 1 pF, the voltage divider ratio is already 1/10, which already leads to a notably disturbing surge at 15.

In accordance with the invention this voltage surge is compensated in that the surge voltage U is mixed at the input 13 in opposite phase by means of a second differential amplifier 25. To this end, a voltage of −U is applied to a second input line 26 which is connected to the base of the transistor 27 of the differential amplifier 25 which comprises in addition a transistor 29 and a current source $I_2$.

The current source $I_2$ can be regulated so that the intermixed compensation signal can be made exactly equal to the interference signal.

The base of the transistor 29 is supplied with the constant voltage U/2.

The two differential amplifiers 17 and 25 are jointly supplied with the supply voltage V via resistors $R_3$ and $R_4$. The output signal of the circuit can be tapped at the resistor $R_3$.

The voltage, current, resistance and capacitance values stated in the drawing are those employed in an example actually built, but of course other values are also possible.

We claim:

1. A pulse generator circuit for generating pulses having predetermined slopes, comprising
a capacitor that can be charged and discharged through predetermined current sources;
a switching device for connecting and disconnecting the current sources and a step function signal source for controlling the switching device, the capacitance of the capacitor being in the range of the stray capacitance of the switching devices; and means for superimposing a fraction of the output signal of the step function signal source in opposite phase upon the output signal of the capacitor so as to compensate the voltage surge in the output signal of the capacitor resulting from the voltage divider formed by the stray capacitance of the switching device and the capacitor.

2. A pulse generator circuit in accordance with claim 1, wherein the output signal of the capacitor and the compensation signal are applied to differential amplifiers respectively, connected in parallel to a common output.

3. A pulse generator circuit in accordance with claim 1, wherein the switching device takes the form of a diode bridge having its corners connected to the current sources, the source of the step function signal and the capacitor in a manner such that a positive voltage surge causes the capacitor to be charged through the first current source and a negative voltage surge causes the capacitor to be discharged through the second current source.

4. A pulse generator circuit in accordance with claims 2 or 3, wherein a second diode bridge being substantially identical to the first diode bridge is connected to the second input of the first differential amplifier, and wherein for the purpose of compensating a displacement of the operating point, the second diode bridge is supplied with a constant signal instead of the step function signal.

* * * * *